United States Patent [19]
Hashitani et al.

[11] Patent Number: 5,744,516
[45] Date of Patent: Apr. 28, 1998

[54] BIODEGRADABLE RESIN MOLDED ARTICLE

[75] Inventors: Takafumi Hashitani; Shozo Fujita; Makoto Iijima; Koji Asano, all of Kawasaki, Japan

[73] Assignee: Fujitsu Limited, Kawasaki, Japan

[21] Appl. No.: 712,113

[22] Filed: Sep. 11, 1996

Related U.S. Application Data

[63] Continuation of Ser. No. 402,568, Mar. 13, 1995, abandoned, which is a continuation of Ser. No. 250,437, May 27, 1994, abandoned.

[30] Foreign Application Priority Data

Sep. 14, 1993 [JP] Japan ................. 5-229265
Dec. 27, 1993 [JP] Japan ................. 5-332493
Dec. 28, 1993 [JP] Japan ................. 5-336070

[51] Int. Cl.$^6$ ............................................. C12N 1/20
[52] U.S. Cl. .................. 523/124; 523/122; 523/125; 435/252.5; 435/253.1; 435/832; 435/833; 435/834; 435/835; 435/836; 435/837; 435/838; 435/839; 435/863
[58] Field of Search ..................... 523/122, 124, 523/125, 126, 128; 435/252.5, 253.1, 832, 833, 834, 835, 836, 837, 838, 839, 863

[56] References Cited

U.S. PATENT DOCUMENTS

| | | | |
|---|---|---|---|
| 3,227,415 | 1/1966 | Masuda et al. | |
| 3,850,863 | 11/1974 | Clendinning et al. | 523/128 |
| 3,901,838 | 8/1975 | Clendinning et al. | |
| 3,931,068 | 1/1976 | Clendinning et al. | 524/17 |
| 3,932,319 | 1/1976 | Clendinning et al. | |
| 4,017,450 | 4/1977 | Bailey. | |
| 4,259,203 | 3/1981 | Lorquet. | |
| 4,358,583 | 11/1982 | Walker et al. | |
| 4,477,654 | 10/1984 | Holmes et al. | |
| 4,477,655 | 10/1984 | Holmes. | |
| 4,483,955 | 11/1984 | Christiansen et al. | |
| 4,520,102 | 5/1985 | Bunno et al. | |
| 4,876,331 | 10/1989 | Doi. | |
| 4,980,023 | 12/1990 | Salkinoja-Salonen. | |
| 5,217,803 | 6/1993 | McBride et al. | |
| 5,254,607 | 10/1993 | McBride et al. | |
| 5,264,030 | 11/1993 | Tanabe et al. | 106/471 |
| 5,283,062 | 2/1994 | Elliott et al. | 424/401 |
| 5,352,709 | 10/1994 | Tarrant et al. | 524/9 |
| 5,393,804 | 2/1995 | George et al. | 523/124 |

FOREIGN PATENT DOCUMENTS

| | | |
|---|---|---|
| 0 450 777 A2 | 10/1991 | European Pat. Off. . |
| 450777 | 10/1991 | European Pat. Off. . |
| 0 488 603 A2 | 6/1992 | European Pat. Off. . |
| 0 624 455 A2 | 11/1994 | European Pat. Off. . |
| A 3-290461 | 12/1991 | Japan . |
| A 4-146952 | 5/1992 | Japan . |
| A 4-325526 | 11/1992 | Japan . |
| 0065420 | 3/1993 | Japan ................. 523/128 |
| A 5-51073 | 3/1993 | Japan . |
| 1 487 050 | 9/1977 | United Kingdom . |
| 1 494 685 | 12/1977 | United Kingdom . |
| 2 246 355 | 1/1992 | United Kingdom . |
| WO 93/05668 | 4/1993 | WIPO . |

OTHER PUBLICATIONS

"Biodegradable Plastic"; Abstract, Fujitsu, 44, vol. 3; pp. 184–188; May 1993.

Derwent Abstract of JP 6-115601 (Jul. 15, 1994).

Derwent Abstract of JP 5-320323 (May 24, 1994).

Derwent Abstract of JP 5-97561 (Nov. 16, 1993).

Derwent Abstract of JP 5-70696 (Nov. 16, 1995).

Derwent Abstract of JP 3-277656.

Biologisch abbaubare Kunststoffe; T. Jopski, Arlesheim/Schweiz; pp. 748–751 Car Hanser Verlag, München 1993.

WPI Abstract Acession No. 93–096870/12 & JP 050039412, Calp Kogyo KK; Aug. 2, 1991.

WPI Abstract Accession No. 95–252240/33; Derwent Publications, Ltd.; Abstract, JP 7 157 439 A; (Eisa Co., Ltd.) Jun. 20, 1995.

WPI Abstract Accession No. 92–278169/46; Derwent Publications, Ltd.; Abstract, JP 4 279 520 A; (Eisa Co., Ltd.) May 10, 1992.

*Primary Examiner*—Peter A. Szekely
*Attorney, Agent, or Firm*—Armstrong, Westerman, Hattori, McLeland & Naughton

[57] ABSTRACT

A biodegradable resin molded article molded from a kneaded material obtained by kneading, melting or mixing a biodegradable resin raw material and at least one of a biodegradable additive and an additive made of a substance existing in the nature, an injection molded article of a biodegradable resin containing a biodegradable resin and an anti-biotic substance, a molded article of a resin composition including a polymer material having an ester bond in the polymer main chain thereof and an alkali or acid component in an amount effective for neutralizing an acidic or alkaline component contained in the polymer material, and a resin molded article having a layer of a biodegradable resin, and a layer of a photolytic resin covering the resin layer and containing an antibiotic.

7 Claims, 8 Drawing Sheets

BIODEGRADABLE RESIN MOLDED ARTICLE

This application is a File Wrapper Continuation of application Ser. No. 08/402,568, filed Mar. 13, 1995, now abandoned, which is a File Wrapper Continuation of application Ser. No. 08/250,437, filed May 27, 1994, now abandoned.

BACKGROUND OF THE INVENTION

1. Field of the Invention

This invention relates to a biodegradable resin molded article and to a method of recovering resources. More particularly, the present invention relates to a biodegradable resin molded article usable when durability is required, and a method of recovering resources.

2. Description of the Related Art

Biodegradable resins which are completely decomposed and digested by bacteria in the soil have drawn increasing attention recently with an increase in awareness of the earth's environment.

Several patent applications have already been filed for molded articles using such a resin (e.g. Japanese Unexamined Patent Publication (Kokai) Nos. 3-290461, 4-146952 and 4-325526). These molded articles are used particularly as a film or a packaging material, and durability is not required.

However, it is expected that recovery of durable consumer goods such as electric products, computers, and so forth, will be required in the near future, and research and development has therefore been under way to obtain a material for casings, etc., which can be decomposed. Biodegradable resins are believed to be advantageous in this aspect because decomposition treatment of the recovered molded articles can be carried out at a relatively low cost. To use a molded article as a durable material, it must have sufficient strength and durability. However, a degradable resin which has satisfactory degradability, strength and durability for application as a durable material has not yet been known at present.

In the case of an electric circuit substrate used for electronic appliances, a thermosetting resin is used in most cases with the exception of inorganic materials such as ceramics, and wiring is formed on the substrate surface. It is very difficult to melt and fuse the thermosetting resin. To separate and recover wiring metals, a complicated process is necessary. Further, because the thermosetting resin of the electric circuit substrate does not have decomposability, it remains semi-permanently at the site where it is disposed of and buried.

From the aspect of saving of resources, on the other hand, it is necessary not only to separate the materials but also to recover raw materials.

Since the biodegradable resin is decomposed by bacteria (e.g., mold), it is likely to be degraded or decomposed by bacteria during its use. Therefore, the field of application has been limited to disposable items such as dust bags. To use the biodegradable resin for a long time, degradation by bacteria must first be restricted. Therefore, an attempt has been made to retard biodegradation of the resin by adding an antibiotic (Japanese Unexamined Patent Publication (Kokai) No. 5-51073).

However, the direct addition of the antibiotic to the biodegradable resin involves the problem that control of emission of the antibiotic is difficult. In other words, if emission of the antibiotic occurs too quickly, the effect of the antibiotic will be insufficient. If it is too slow, on the other hand, the period before the start of biodegradation will become too long.

SUMMARY OF THE INVENTION

In view of the technical problems with the prior art described above, the present invention aims at providing a biodegradable resin molded article having strength and durability, and a method of recovering resources.

It is another object of the present invention to provide a biodegradable resin molded article which controls biodegradability.

To solve the problems described above, the present invention provides a biodegradable resin molded article molded from a kneaded material obtained by kneading, melting or mixing a biodegradable resin raw material and at least one of an additive having biodegradability and an additive consisting of a substance existing in nature.

The present invention also provides a resin molded article containing a layer of a resin having biodegradability and a layer of a photolytic resin covering the resin layer and containing an antibiotic.

DESCRIPTION OF THE PREFERRED EMBODIMENTS

Figure 1:
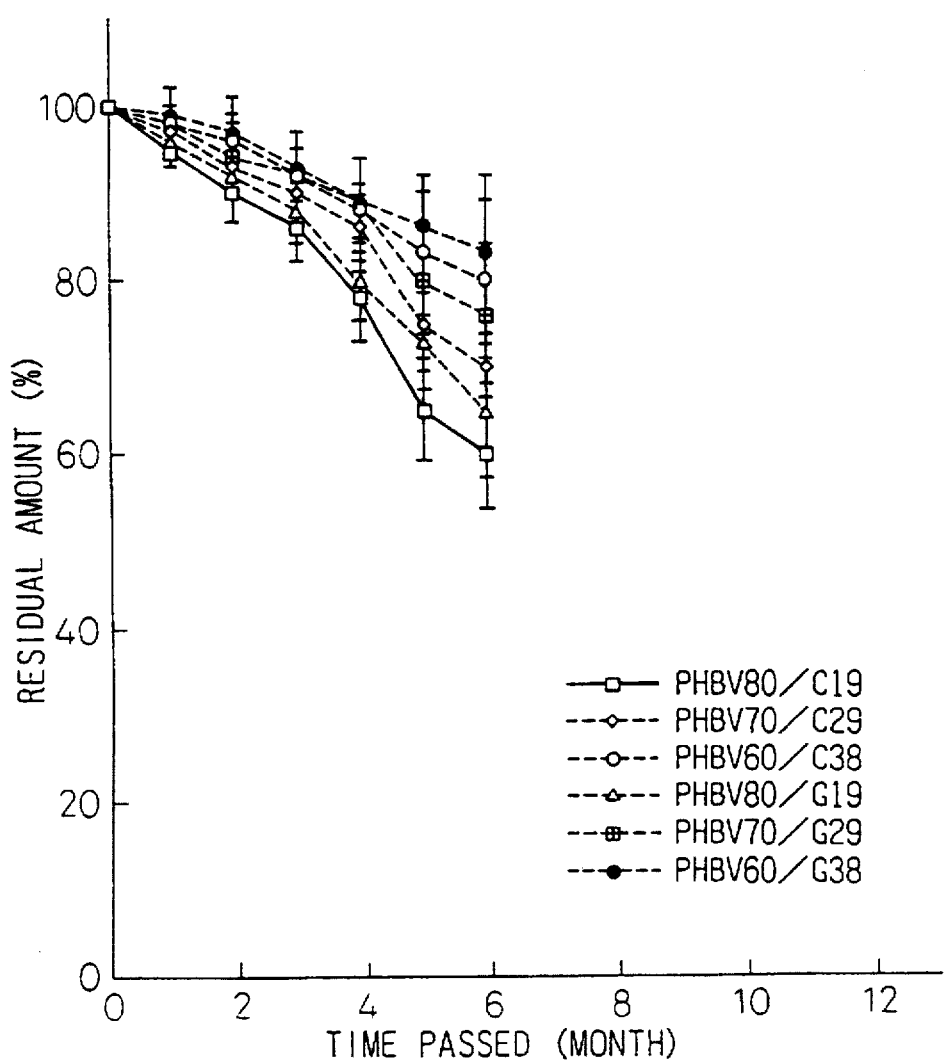
FIG. 1 is a diagram showing decomposability of a biodegradable resin molded article in the soil according to an example of the present invention.

The kneaded material described above, which is used for the present invention, preferably contains a biopolymer as an additive, particularly one having biodegradability. This biopolymer may be a vegetable oil, collagen or a high- or ultra-high thermophilic bacteria.

The kneaded material described above preferably contains a fibrous or fine powdery material consisting of at least one member selected from carbon, silicon oxide and silicon dioxide as an additive made of a substance existing in nature. Alternatively, the kneaded material preferably contains at least one of magnesium hydroxide and aluminum hydroxide as the additive made of a substance existing in nature.

A biodegradable resin raw material is preferably at least one member selected from a polyester, an aliphatic polyester which is produced by microorganisms, polyvinyl alcohol, polycaprolactone, polyhydroxyalkanoate, denatured starch, natural polymer and polyisocyanate.

The biodegradable resin molded article described above can be molded by extrusion-molding or injection-molding the kneaded article into a film. This biodegradable resin molded article may be a flat sheet-like electric circuit substrate having wirings formed on the surface thereof, for example.

According to the present invention, there is provided a method of recovering resources which comprises decomposing the biodegradable resin molded article described above by microorganisms and recovering the biodegradable resin raw material built up in the microorganisms therefrom.

The inventors of the present invention have discovered a biodegradable resin, which has improved strength and durability and can be used as a durable material, by mixing various biodegradable resin raw materials with an additive having biodegradability. The present inventors have also discovered a biodegradable resin having improved strength and durability and applicable as a durable material by mixing various biodegradable resin raw materials with a material existing in large quantities in nature, such as at least one member of carbon, silicon oxide and silicon dioxide.

Examples of such a biodegradable resin raw material include a polyester, an aliphatic polyester, which is produced by microorganisms polyvinyl alcohol, polycaprolactone, polyhydroxyalkanoate, denatured starch, a natural polymer and a polyisocyanate. On the other hand, the additive has the functions of a plasticizer, a filler and a flame retardant depending on the kind of the material, and a biopolymer having biodegradability is used as one of the additives. Such a biopolymer is a vegetable oil, collagen or a high- or super-high thermophilic bacteria. They can be decomposed by bacteria.

Further, those articles which are made of a substance existing in nature such as carbon, silicon oxide or silicon dioxide and are shaped into a fibrous or fine powdery article, can also be used. It is particularly preferred to add magnesium hydroxide or aluminum hydroxide as an inorganic flame-retardant to the resin which is used for an electric circuit substrate the temperature of which is likely to become high. Incidentally, the substance existing in nature and mixed as the additive is not biologically decomposed, but after the resin is decomposed, only the components which exist in nature remain. Accordingly, an adverse influence on the natural environment can be reduced to a minimum.

The biodegradable resin kneaded material prepared by mixing the biodegradable resin raw material and the additive described above is molded by extrusion molding or injection molding, and the strength of the resulting molded article is tested. As a result, a tensile strength and an Izod impact value equivalent to, or higher than, those of polypropylene or an ABS resin can be obtained. Unlike polypropylene and the ABS resin, the molded article can be decomposed within about one year when it is buried in the soil.

As described above, the biodegradable resin molded article according to the present invention has biodegradability and has sufficient strength and durability required for the application as a durable material such as electric products and casing of computers.

The resin having biodegradability described above is decomposed and disappears in a culture solution or a soil containing bacteria. Accordingly, the volume of waste can be reduced, and wiring metal from electric circuit substrates can be recovered. The resin raw materials built up in the bacteria can be extracted and recycled.

According to the present invention, there is further provided an injection molded article of a biodegradable resin containing a biodegradable resin and an antibiotic substance.

The application of the biodegradable resins has progressed in recent years with increasing awareness of the earth's environment. The biodegradable resin has a property such that it can be assimilated and decomposed by a certain kind of bacteria. Unlike ordinary general-purpose resins, the biodegradable resin is decomposed and disappears when it is left standing in nature. Therefore, it has drawn remarkable attention at present as a resin for injection molding, because it does not have any adverse influence on the natural environment. However, this resin involves a problem that its long-term durability is low in the natural environment or in an environment analogous thereto for the very reason that it is biodegradable. The injection molded article according to the present invention can solve such a problem.

The following six kinds of antibiotics can be listed as being useful, though there are a large number of kinds of antibiotics that can be used depending on their actions on the bacteria.

(1) Those which impede biosynthesis of peptidoglycan of a cellular membrane:

β-lactam type compounds such as penicillin, cephalosporin (2) Those which impede biosynthesis of proteins of bacteria:

puromycin, tetracycline, chloramphenicol, erythyromycin, streptomycin, etc.

(3) Those which impede biosynthesis of nucleic acid:

azaserine, acridine, actinomycin D, bathomycin, rifamycin, etc.

(4) Those which change ion permeability of a cellular membrane:

ionophores such as parinomycin, gramicidin A, nonactin, monensin, etc.

(5) Those which destroy a cellular membrane:

phenols such as chlorocresol, xylol, etc., quaternary ammonium salts such as benzalkonium chloride, biguanide compounds such as chlorohexydine, and cyclic peptides such as tyrocidin, gramicidin, polymyxin, etc.

(6) Metal ions:

silver ion and its complex compounds.

When one or more of these substances are blended in a relatively small amount into the resin, biodegradability can be suppressed for a predetermined period until these substances are chemically decomposed and inactivated or are caused to flow out by moisture, etc., existing in nature. A similar effect can be obtained by mixing a material having any of these substances chemically bonded to the polymer chain thereof.

Incidentally, each of these substances has a different antibiotic property, chemical stability and solubility in moisture. It is therefore important technically to sufficiently consider the amount thereof mixed with the resin. When an economic effect is also simultaneously taken into account, a particularly suitable mixing amount is from 0.01 to 100 ppm for the substances of the groups (1), (2), (3) and (4), and from 0.01 to 5 wt % for the substances of the groups (5) and (6), on the basis of the resin.

Blending is generally carried out at the time of kneading of the resin in the same way as mixing of other additives and the fillers. However, it is preferred to carry out kneading at a temperature as low as possible and within a short time in order to restrict the decomposition of the antibiotic substances. There may be the case where uniform mixing cannot be easily carried out under such a condition, but a method which prepares a master batch in advance is particularly effective for mixing a trace amount of the substance. The silver ion of (6) involves the problem that it is easily decomposed by ultra-violet rays, reacts with chlorine ions contained in running water, etc., to form a silver chloride, and is likely to be inactivated. Therefore, a method which causes the ion to be absorbed by fine powder of a silica gel support may be used.

According to the present invention, there is further provided a modification method of a resin which keeps a resin substantially neutral by adding and mixing an alkali or acid component in an amount effective for neutralizing acidic or alkaline components contained in a polymer material having an ester bond or bonds in the polymer main chains thereof.

The present invention provides further a resin composition containing a polymer material having an ester bond in the polymer chain thereof and an alkali or acid component in an amount effective for neutralizing an acidic or alkaline component contained in the polymer material, and a resin molded article prepared from such a resin composition.

Recently, the application of polymer materials having an ester bond (so-called "polyester resins") has progressed. The polyester resins can be broadly divided into two kinds, that is, a thermosetting resin and a thermoplastic resin. Though the present invention is effective for both of these kinds, it is particularly effective for the latter. The thermoplastic resin includes a so-called "aromatic type" which contains a benzene ring in its molecular chain such as polyethylene terephthalate (PET), and those which wholly consist of aliphatic hydrocarbons. The latter includes those resins which are decomposed by bacteria, that is, biodegradable resins such as those comprising poly-3-hydroxybutyrate, poly-3-hydroxyvalerate, etc.

Since all of these resins have an ester bond, they can be synthesized relatively easily. Chemically, they are ordinarily synthesized through polycondensation between dicarboxylic acids and glycols. Therefore, various resins can be synthesized relatively easily under analogous synthesizing conditions by selecting and combining these materials.

On the other hand, this point constitutes the drawback of the resins of this kind. In other words, when a resin of this kind is used for a long period or under a chemically severe condition, there occurs a problem that only a limited part of the ester bond is hydrolyzed and the polymer chain is cut off, so that the material properties are deteriorated. It is known from another study that when the portion which is cut off is the molecular chain, the deterioration in the material properties such as the strength is greatly affected even when the cut portion is only a very limited part. Therefore, it is very important to control this reaction.

The inventors of the present invention have conducted studies on the mechanism of hydrolysis in order to mitigate these problems, and have clarified the following points. The resin often contains a trace amount of an acidic or basic (alkaline) material due to impurities contained in the starting materials at the time of synthesis of the resin or due to a pH environment at the time of synthesis. Generally, hydrolysis is greatly promoted by an acid or a base (alkali). Accordingly, when the material is put in a wet environment, it has been clarified that these components of the resin promote the cutting reaction of the polymer chain of the resin (ester exchange reaction). The inventors of the present invention have carried out quantitative determination of these components contained in the resin to restrict this reaction, and have found out that durability of the resin can be improved by reducing these acidic or alkaline contents by a neutralization reaction. The present invention has thus been completed. It is preferred in this instance that the alkali or the acid component for neutralization to be added is converted in advance to fine powder and is sufficiently kneaded.

According to the second aspect of the present invention, the biodegradable resin molded article is shaped into a laminar structure, and an antibiotic is added to only its outermost layer so as to prevent the resin from being degraded by the bacteria. The outermost layer of this molded article is formed by coating a resin having photolytic property so that the antibiotic can be retained by the photolytic resin.

Typical examples of the biodegradable resins useful for the present invention are poly(3-hydroxybutyric acid), 3-hydroxybutyric acid/3-hydrovaleric acid copolymer, 3-hydroxybutyric acid/4-hydroxybutyric acid copolymer, chitin-chitosan, cellulose-chitosan, polylactic acid, polyglycolic acid, polycaprolactone, amide ester copolymers, polyester ethers, polyvinyl alcohol, and so forth.

Examples of the photolytic resins are ethylene/carbon monoxide copolymer, vinyl ketone/vinyl monomer copolymer, polyisobutylene oxide, and so forth.

Examples of the antibiotics are 2-(4-thiazolyl)-benzimidazole, 2-(methoxycarbonylamino)-benzimidazole, bis(2-pyridylthio-1-oxide)zinc, diiodemethyl-p-tolylsulfone, zeolite/silver, hydroxyapatite/silver, silica/silver, and so forth.

The biodegradable resin molded article according to the present invention described above does not undergo degradation by the bacteria during its use and can be used for a long time. When the molded article becomes unnecessary, visible light or ultraviolet rays are irradiated onto the molded article so as to decompose and remove the photolytic resin. In this way, the antibiotic layer is removed. The antibiotic layer can also be removed by the same method when the molded article is a thin molded article.

As described above, the bacterial resistance as well as durability of the biodegradable resin are improved by disposing the photolytic resin layer containing the antibiotics on the surface of the biodegradable resin. When the resin molded article becomes unnecessary, it is left standing outdoors, whereby the photolytic resin is decomposed and the antibiotic is emitted and loses its antibiotic property. Then, decomposition of the biodegradable resin takes place.

Hereinafter, the present invention will be explained in further detail with reference to Examples thereof.

Example 1

Biodegradable Plastic Molded Article

This example used a polyester type copolymer (PHBV) consisting of hydroxyvalerate (HV) and hydroxybutyrate (HB) and having a polymerization ratio of 5:95 as biodegradable plastic raw materials which were decomposed by bacteria in the soil. A mixture of an aliphatic acid ester as a plasticizer and a carbon fiber or glass fiber having a sectional diameter of 0.3 to 1 μm and a length of 0.1 to 20 mm as a filler for improving the strength of a molded article was used as a plastic kneaded material. To compare the strength and decomposition activity, three kinds of samples having various mixing ratios of the plasticizer and the filler were prepared.

Table 1 tabulates the composition ratio of each plastic composition using the carbon fiber.

TABLE 1

| Experiment | PHBV (%) | plasticizer (%) | filler*[1] (%) | tensile strength (MPa) |
|---|---|---|---|---|
| 1 | 80 | 1 | 19 | 30 |
| 2 | 70 | 1 | 29 | 42 |
| 3 | 66 | 2 | 38 | 53 |
| Comparative Examples: | polypropylene | | | 20–30 |
| | ABS resin | | | 30–40 |

*[1]filler: carbon fiber

Table 2 tabulates the composition ratio of each plastic composition using the glass fiber.

TABLE 2

| Experiment | PHBV (%) | plasticizer (%) | filler*[2] (%) | tensile strength (MPa) |
|---|---|---|---|---|
| 1 | 80 | 1 | 19 | 35* |
| 2 | 70 | 1 | 29 | 46 |
| 3 | 60 | 2 | 38 | 70 |
| Comparative Examples: | polypropylene | | | 20–30 |
| | ABS resin | | | 30–40 |

*[2]filler: glass fiber

Next, each plastic composition was melted and kneaded at 165° C. inside an injection molding machine and was then injected into a flat mold to form three kinds of plastic molded articles each having the shape of a standard tensile test testpiece (JIS K7113, dumbbell shape).

The tensile test was conducted for each of the plastic molded articles in accordance with JIS K7113. For comparison, the same tensile test was conducted for polypropylene and the ABS resin.

The results are tabulated in Tables 1 and 2. The tensile strength is expressed by the stress (unit: mega-Pascal, MPa) at the time of breakage of the testpiece.

In the testpieces containing the carbon fiber or the glass fiber, the tensile strength increased in proportion to the proportion of addition of the carbon fiber or the glass fiber. When the proportion of addition of the carbon fiber or the glass fiber is the same, the glass fiber provided a greater tensile strength than the carbon fiber. Further, the biodegradable plastics provided a greater tensile strength than polypropylene and the ABS resin.

Next, each testpiece was buried in a compost of kitchen refuse and its decomposition activity was measured over the course of six months. The result is shown in FIG. 1. The abscissa represents the time past (month) and the ordinate represents the remaining quantity (%). Incidentally, symbols in the figure, such as PHBV 80/C19, represent a molded article molded from the kneaded material of the copolymer (PHBV) 80% and the carbon fiber (C) 19%, and other symbols have a similar meaning, with the symbol G representing the glass fiber.

It could be understood from the results that the molded articles were decomposed more quickly when the mixing ratio of the carbon fiber was smaller. Namely, the molded article having a mixing ratio of 19% exhibited a remaining quantity of 60% after six months and those having a mixing ratio of 38% exhibited a remaining quantity of 80% after six months. The molded articles containing the glass fiber were also decomposed more quickly with a smaller mixing ratio of the glass fiber in the same way as the molded articles containing the carbon fiber. Namely, the molded articles having a mixing ratio of 19% exhibited a remaining quantity of 65% after six months and those having a mixing ratio of 38% exhibited a remaining quantity of 85% after six months. These facts indicate that all the molded articles were steadily decomposed with the passage of time.

Biodegradability was substantially analogous to the cases in which the filler was not added, and only the carbon fiber remained in the soil after the decomposition, and did not do any harm to the ecosystem.

Example 2

Biodegradable Plastic Molded Article

A copolymer (PHBV) of hydroxyvalerate (HV) and hydroxybutyrate (HB) having a copolymerization ratio of 5:95 was used as the biodegradable plastic raw materials. A plastic kneaded material used was prepared by adding extinct *Thermus thermophilis* HB8 as a filler. To compare the strength and the decomposition activity, three kinds of molded articles having different mixing ratios of the thermophilic bacteria were prepared.

Table 3 tabulates the composition ratio of each plastic composition.

TABLE 3

| Experiment | PHBV (%) | thermophilic bacteria (%) | tensile strength (MPa) | Izod impact value (Jm$^{-1}$) |
|---|---|---|---|---|
| 1 | 90 | 10 | 35 | 400 |
| 2 | 80 | 20 | 28 | 350 |
| 3 | 70 | 30 | 25 | 250 |
| Comparative Examples: | polypropylene | | 20–30 | 60–1,000 |
| | ABS resin | | 30–40 | 300–450 |

Next, each plastic composition was melted and kneaded at 165° C. inside an injection molding machine and was injected to a flat sheet mold to form three kinds of plastic molded articles each having a flat sheet-like shape of 8×100×100 mm.

The tensile test and the Izod impact test were conducted for each of the plastic molded articles in accordance with JIS K7113 and JIS K7110, respectively.

The results are tabulated in Table 3. The tensile strength is expressed by the stress (unit: mega-Pascal, MPa) at the time of break of the testpiece. The Izod impact value is expressed by the magnitude of energy (J/M) which the testpiece absorbed at break, and was measured by striking each testpiece with a hammer and measuring the rebound height of the hammer.

It could be understood from the results that the smaller the mixing ratio of the thermophilic bacteria, the greater became both the tensile strength and the Izod impact value. These values were substantially equal to the values of polypropylene and the ABS resin, and testpieces had a strength sufficient for durable material use.

Figure 2:
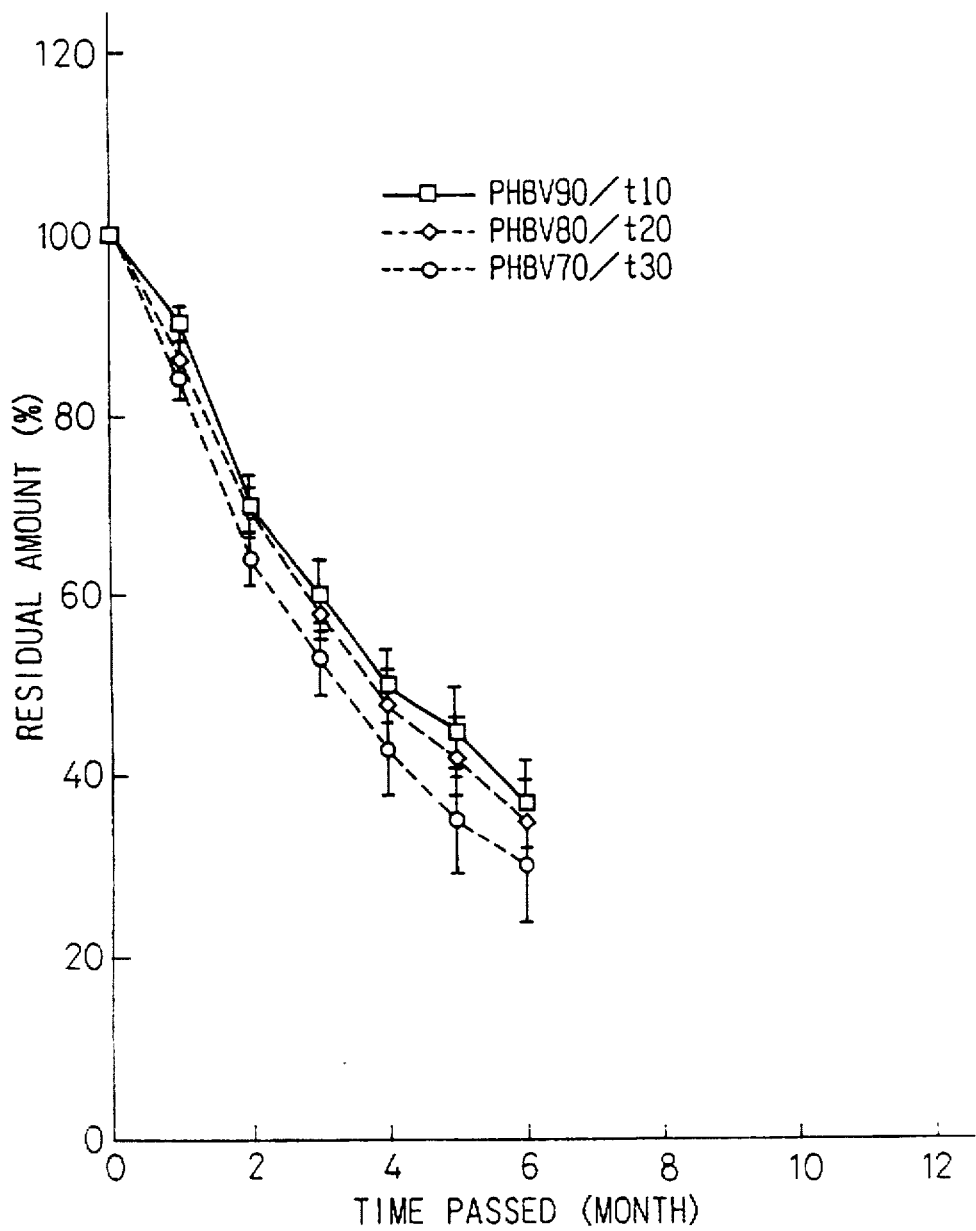
FIG. 2 is a diagram showing decomposability of a biodegradable resin molded article in the soil according to an example of the present invention.

Next, each testpiece was buried in a compost of kitchen refuse and its decomposition activity was measured over the course of six months. The result is shown in FIG. 2. In the figure, the abscissa represents the time past (month) and the ordinate represents the remaining quantity (%). By the way, symbols in the figure, such as PHBV90/t10, represent a molded article molded from the kneaded material of the copolymer (PHBV) 90% and the thermophilic bacteria (t) 10%, and other symbols have similar meanings.

It could be understood from the results that the molded articles were decomposed more quickly when the mixing ratio of the thermophilic bacteria was great. Namely, the molded article having a mixing ratio of 30% exhibited a remaining quantity of 30% after six months and the molded article having a mixing ratio of 10% exhibited the remaining quantity of 35% after six months. According to extrapolation, it was expected that all the testpieces would be completely decomposed within about 10 months after they were buried. The decomposition ratio was considerably higher than the testpieces not containing the thermophilic bacteria.

Example 3

Electric Circuit Substrate

Next, a method of producing an electric circuit substrate consisting of the biodegradable plastic molded article will be explained next.

Natural polymers such as polyhydroyxalkanoate, polycaprolactone, denatured starch, chitin-chitosan, etc, and polyisocyanate, etc., were used as the biodegradable plastic raw materials.

A flame retardant was added to cope with exothermy of the circuit in view of the property of the electric circuit substrate. An inorganic flame retardant such as innoxious magnesium hydroxide or aluminum hydroxide was used as a material which did not affect biodegradability and also did not exert an adverse influence on living creatures in the natural environment. The amount of addition was preferably from 10 to 20 wt % because machinability dropped when the amount of addition was greater.

Further, the biodegradable plastic materials have generally a low softening point and therefore involve the problem that their dimensional characteristics are not high at the time of heating. However, these drawbacks can be compensated for by adding 30 to 60 wt % of a fibrous material as a reinforcing agent. Examples of such a reinforcing agent are a glass fiber, a carbon fiber, a cellulose fiber, a fibroin fiber, etc. All of them exist in large quantities in nature and are biopolymers. Accordingly, these can minimize the influence on the bacteria. Incidentally, the cellulose fiber and the fibroin fiber are preferred from the aspect of the reduction of the volume of wastes.

The biodegradable plastic raw materials, the flame retardant and the reinforcing agent described above were mixed and the biodegradable plastic kneaded material was prepared. This biodegradable plastic kneaded material was shaped into a flat sheet-like substrate by extrusion molding, injection molding or film molding.

After a copper foil was formed on this substrate, a circuit wiring was formed by photolithography, and the electric circuit substrate was produced.

Concrete Example 1

A polyester type copolymer consisting of polyhydroxybutyrate (HB) and polyhydroxyvalerate (HV) was used as the biodegradable plastic raw material. In this case, 8 to 15 wt % of polyhydroxyvalerate was preferably contained in consideration of the strength of the molded article and its machinability. Flexibility of the molded article could be increased by increasing the amount of addition of polyhydroxyvaleate, but 9 to 10 wt % was preferred particularly from the aspect of machinability.

10 to 20 wt % of magnesium hydroxide powder was added as a flame retardant to this raw material, and furthermore, 20 to 40 wt % and preferably, 30 to 40 wt %, of a cellulose fiber was added as a reinforcing agent. The aspect ratio (length/diameter ratio) of the cellulose fiber was suitably within the range of 50 to 100. If the cellulose fiber was excessively long, the surface of the molded article would be coarse, and the aspect ratio was particularly preferably within the range of 80 to 90.

A substrate was produced by injection molding this kneaded material. The injection molding condition might be similar to the injection molding condition of polyethylene terephthalate (PET). Thereafter, a circuit wiring was formed on the substrate to produce an electric circuit substrate.

A dielectric constant of this electric circuit substrate is shown in Table 4. Measurement was conducted in accordance with ASTM D150.

TABLE 4

| substrate material | dielectric constant |
|---|---|
| Concrete Example 1 | 4.5 |
| Concrete Example 2 | 5.0 |
| Comparative Examples: | |
| epoxy | 4.8 |
| ceramics | 4.0 |
| polystyrene | 2.5 |

Measured in accordance with ASTM D150

It could be understood from the results tabulated above that a value substantially equivalent to those of epoxy and ceramics could be obtained.

Concrete Example 2

Polycaprolactone was used as the biodegradable plastic raw material, and a mixture of chitin fiber (10 to 30 wt %) as a filler was used. The chitin fiber was a polysaccharide contained in crustaceans in great quantities and was quickly decomposed the nature.

This kneaded article as injection molded to form a substrate, and a circuit wiring was formed on the substrate to form an electric circuit substrate.

The dielectric constant of this electric circuit substrate is also shown in Table 4. According to this result, it could be understood that a value substantially equivalent to those of epoxy and ceramics could be obtained.

Figure 4:
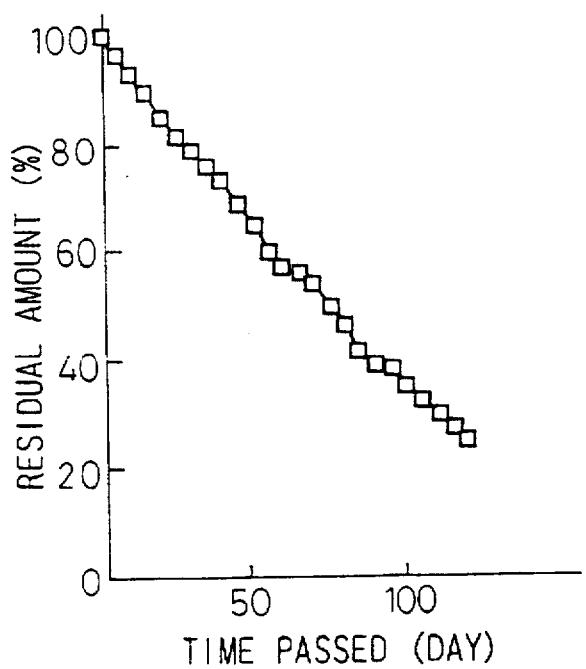
FIG. 4 is a diagram showing decomposability of a biodegradable resin molded article in the soil according to an example of the present invention.

Next, when the circuit substrate of Concrete Example 2 was buried in the compost, the residual quantity of the plastic reached about 30% within about for four months as shown in FIG. 4, and 70% of the initial weight disappeared. In this case, copper used for the wiring could not be recovered due to oxidation.

Example 4

Recovery Method of Resources

Next, a recovery method of biodegradable plastics will be explained. Here, the electric circuit substrate of Example 3 was used as an example of the molded article.

After the electric circuit substrate was produced, it was immersed in a culture solution containing bacteria such as Pseudomonas sp., Alcaligenes sp., Rhodospirillium sp., Zoogloea sp., etc. In this way, the plastics of the substrate could be completely decomposed.

In this case, the flame retardant, the reinforcing agent, etc., contained in the plastics of the substrate precipitated to the bottom of the culture tank, while metal components remained without decomposition. Accordingly, both of them could be easily recovered.

Further, after the decomposition treatment, the bacteria in the culture solution were recovered. Next, the plastics built up in the bacteria were extracted by dissolving them in a solvent. New plastics could be formed again from this extract.

Even when the article was discarded as waste into the natural environment, only those components which existed in nature remained after the decomposition of the plastics. Accordingly, any adverse influence on the natural environment could be reduced to a minimum.

Concrete Example 3

A culture solution shown in Table 5 was placed into a culture tank and *Alcaligenes feacalis* as a bacteria was incubated. The electric circuit substrate of Concrete Example 1 was immersed in this culture solution and was left standing as such.

TABLE 5

| Composition of culture solution | |
| --- | --- |
| NH$_4$Cl | 0.10% |
| MgSO$_4$.7H$_2$O | 0.05% |
| CaCl$_2$.2H$_2$O | 0.0005% |
| KH$_2$PO$_4$/Na$_2$HPO$_4$ | 66 mM |

*bacteria: *Alcaligenes feacalis*

Figure 3:
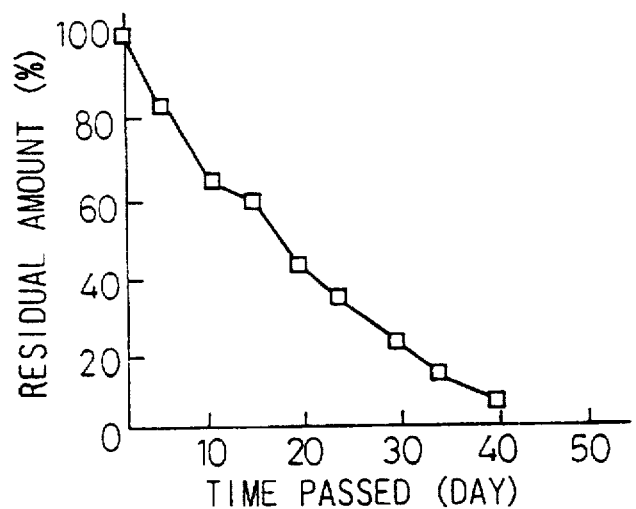
FIG. 3 is a diagram showing decomposability of a biodegradable resin molded article in a culture solution according to an example of the present invention.

When the substrate was 3 mm-thick as shown in FIG. 3, almost all the plastic components were decomposed and disappeared at 30° C. within 40 days.

After the decomposition was completed, the fungus body (bacteria) was recovered by centrifugal separation and was dissolved in a solvent so as to extract polyhydroxybutyrate/ polyhydroxyvaleate copolymer. The recovery ratio was as good as about 60%.

The flame retardant, the reinforcing agent, etc., precipitated to the bottom of the culture tank while the metal components remained undecomposed. Accordingly, both of them could be easily recovered.

Example 5

A resin having higher mechanical properties while keeping biodegradability could be obtained by copolymerizing 3-hydroxybutyrate (HB) and 3-hydroxyvalerate (HV).

A master batch was in advance prepared by blending 1.0 wt % of hexamethylene biguanide to a commercially available HB/HV copolymer ("Biopole S30", a product of Zeneka K.K., HV ratio of about 5%, pellet form), and a resin composition was prepared by blending 10 wt % of the obtained master batch to the same resin. Caution was exercised so as to effect kneading as quickly as possible in any process.

Figure 5:
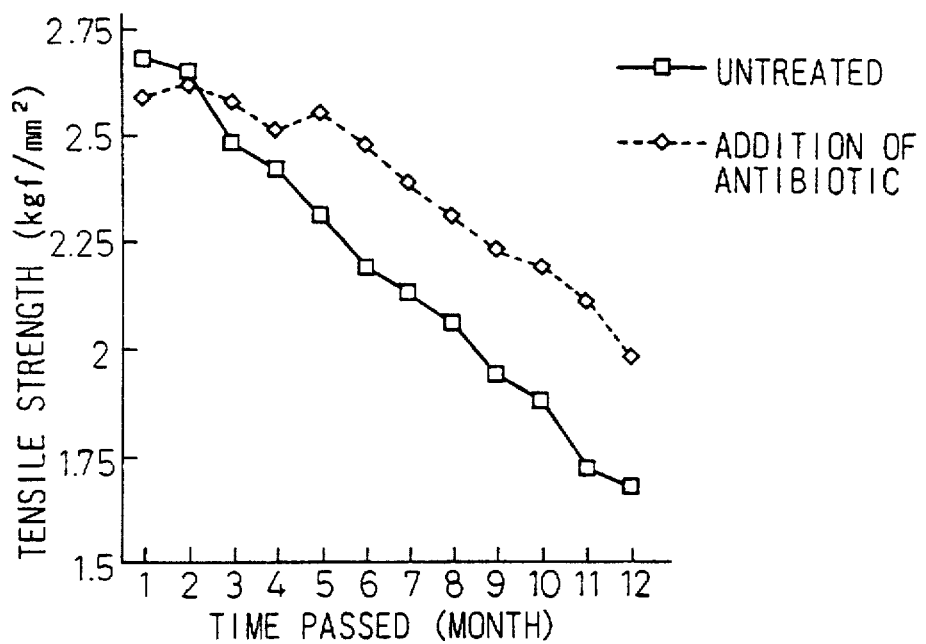
FIG. 5 is a diagram showing decomposability of injection molded articles in the soil according to an example of the present invention and to a comparative example, respectively.

A sheet-like testpiece was produced by injection molding the resulting resin composition, and was buried in the wet soil and left standing for 12 months (mean temperature: 20° C.). When the testpiece was periodically taken out to measure the mechanical properties, great changes were observed between the testpieces. Namely, the testpieces containing the antibiotic had a low degree of degradation for a predetermined period but degradation thereafter proceeded (see FIG. 5). A comparative example without addition of the antibiotic material is listed in FIG. 5.

Example 6

A molded article of a composition prepared by adding starch to a polyvinyl alcohol resin collapses in a natural environment. Therefore, it can be called a biodegradable resin in a broad sense of the word.

Figure 6:
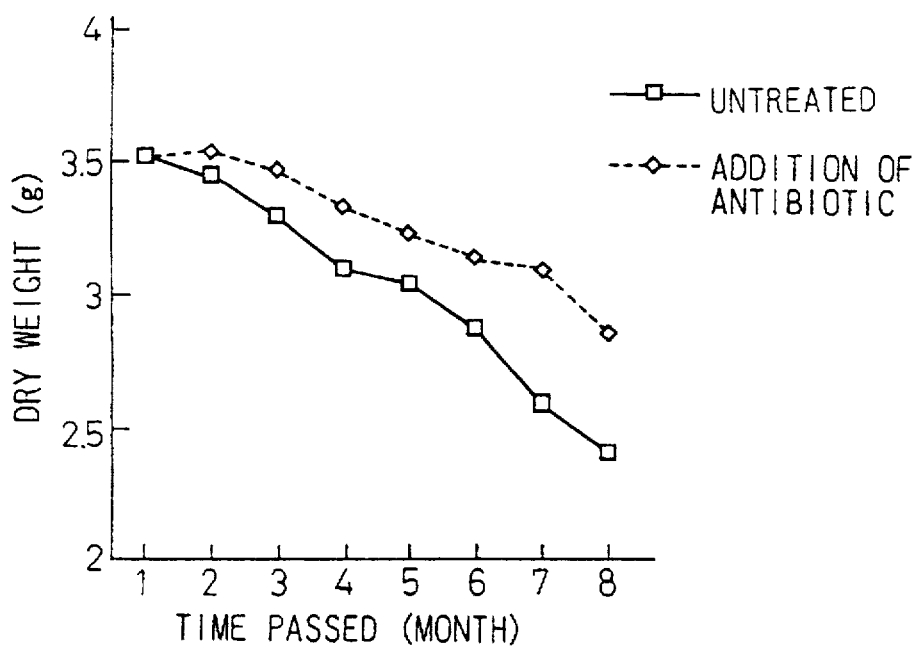
FIG. 6 is a diagram showing decomposability of injection molded articles in the soil according to an example of the present invention and to a comparative example, respectively.

Silica gel fine powder (grain diameter: about 1 mm) absorbing silver nitride was added to "Mattervie", a product of Nippon Gosei Kagaku K.K., as a kind of the resin. Namely, an aqueous solution (1.0%) of silver nitride was sprayed little by little onto a silica gel pulverized to a grain diameter of not greater than 0.1 mm by a ball mill (10 ml of the aqueous solution per 100 g of silica gel), and the silica gel was dried in a dark place at 60° C. for 10 hours. One wt % of the antibiotic composition so prepared was blended with the "Mattervie" by kneading. Sheet-like testpieces were formed by injection molding the resin composition prepared by this method, and were buried in wet soil and left standing for 10 months (mean temperature: 20° C.). When the testpieces were periodically taken out and the weight change was measured, great differences were observed in the degree of the drop in the weight (see FIG. 6). A comparative example without addition of the antibiotic material is listed in FIG. 6.

Example 7

Polycaprolactone (PCL) has biodegradability and is a resin capable of forming an excellent injection molded article having good mechanical properties.

A master batch was prepared in advance by adding 1.0 wt % of trimethylphenylammonium chloride to a commercially available PCL ("Plaxell H-5", a product of Dicell Kagaku Kogyo K.K.), and a resin composition was prepared by further adding 1 wt % of the obtained master batch to the same resin. Caution was exercised so that kneading was effected as quickly as possible throughout all the processes. Particularly, specific attention was paid to the temperature management at the time of melting of the resin, and the treatment was carried out at a relatively low temperature.

Figure 7:
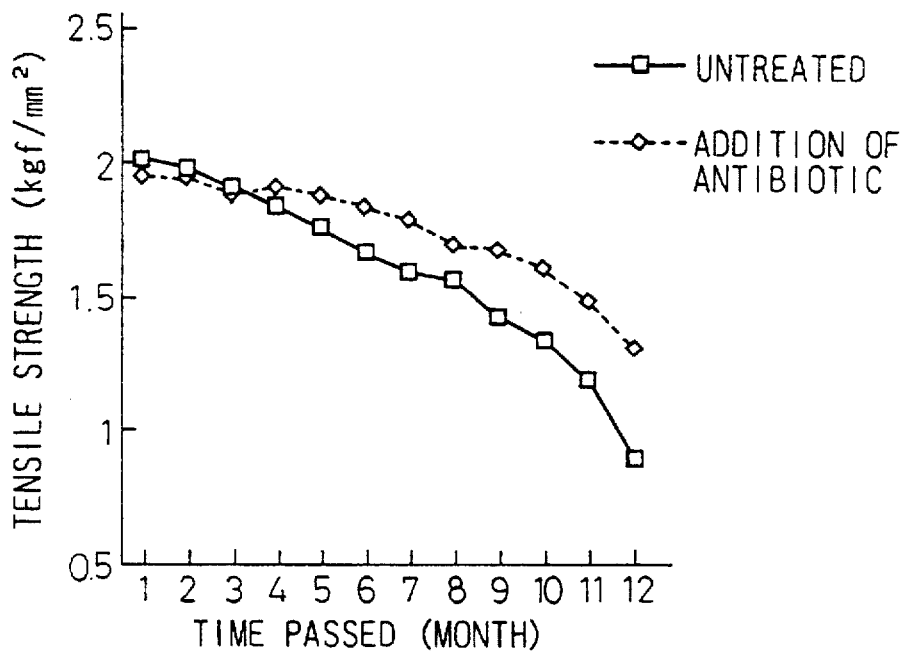
FIG. 7 is a diagram showing decomposability of injection molded articles in the soil according to an example of the present invention and to a comparative example, respectively.

Sheet-like testpieces were produced by injection molding the resin composition so obtained, and were buried and left standing for 12 months in the wet soil (mean temperature: 20° C.). The testpieces were periodically taken out and the mechanical properties were measured. As a result, a great change was observed in the mechanical strength. The testpieces containing the antibiotic exhibited a low degree of degradation for a predetermined time, but thereafter degradation proceeded (see FIG. 7). A comparative example without addition of the antibiotic material is listed in FIG. 7.

Example 8

A resin having excellent mechanical properties while maintaining biodegradability could be obtained by copolymerizing 3-hydroxybutyrate (HB) and 3-hydroxyvalerate (HV).

Figure 8:
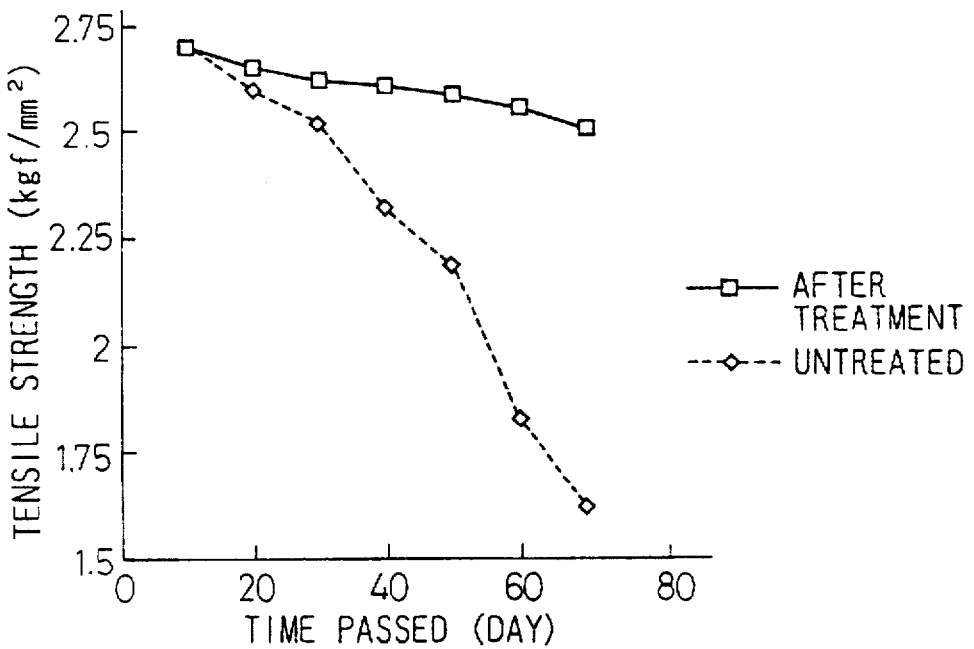
FIG. 8 is a diagram showing decomposability of injection molded articles in a high temperature and high humidity environment according to an example of the present invention and to a comparative example, respectively.
Figure 9:
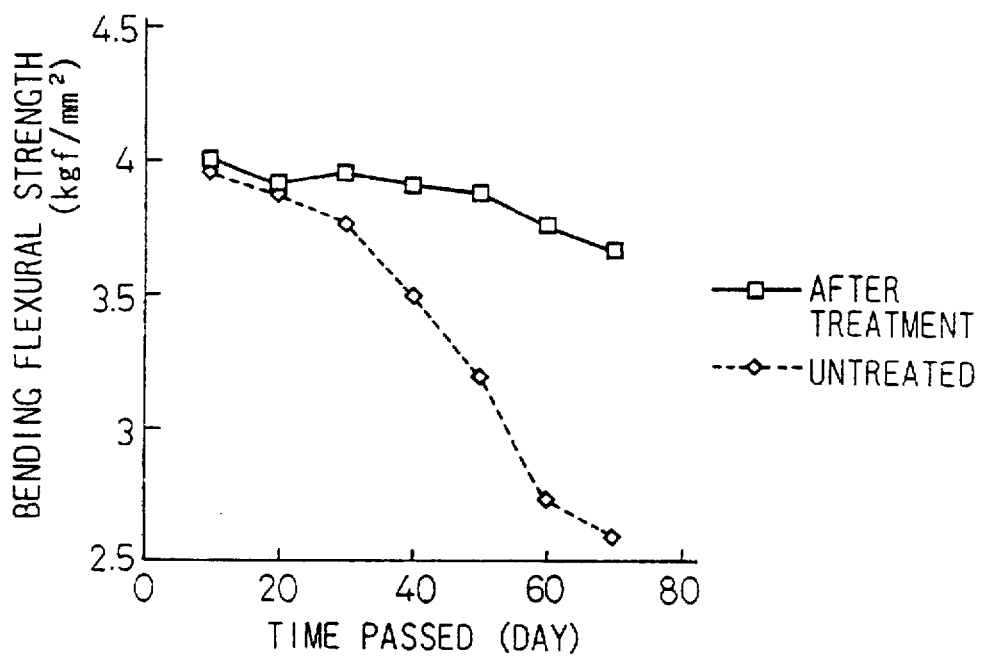
FIG. 9 is a diagram showing decomposability of injection molded articles in a high temperature and high humidity environment according to an example of the present invention and to a comparative example, respectively.

Sheet-like testpieces were produced by injection molding a commercially available HB/HV copolymer ("Biopole S30", a product of Zeneka K.K.; HV ratio=about 5%), and were left standing in an environment of 70° C. and a humidity of 50%. A remarkable drop in the mechanical strength could be recognized (FIGS. 8 and 9). The amount of the water-soluble components (acid or alkali components) on this molded article was analyzed.

The method of analysis was as follows.

After the resin plate was finely pulverized to a grain diameter of not greater than 0.5 mm, the pulverized grains were immersed in a small amount of hot ethanol and left standing for about 24 hours. Then, the solution was isolated by filtration. This solution was extracted by a solvent in a water-ether system to dissolve water-soluble components in water, and this aqueous solution was titrated by strong acid or strong alkali to measure the amount of the acid or alkali components in the resin.

It could be recognized in accordance with this method that the commercially available "Biopole S30" contained 0.2 mmol of the acid component per 100 g of the resin.

Next, this resin was again melted using a resin kneader and 0.1 mmol (0.2 mmol equivalent) of sodium carbonate fine powder (grain diameter of not greater than 0.05 mm) per 100 g of the resin was kneaded and sufficiently mixed. Testpieces were produced by injection molding this resin, and was left standing for 2 months in an environment of 70° C. and a 50% humidity. In this case, the drop in the mechanical strength was not as pronounced as in the original resin (FIGS. 8 and 9).

Example 9

A PET resin is generally used for beverage bottles, etc. This resin plate was finely pulverized to a grain diameter of not greater than 0.5 mm by a ball mill, etc., and a water-soluble component was extracted by the same method as that of Example 8. When the acid or alkali component in the resin was measured, 0.026 mmol of the acid component was found contained in 100 g of the resin.

Next, this resin was again melted using a resin kneader, and 0.026 mmol of potassium carbonate fine powder (grain diameter=below 0.05 mm) per 100 g was kneaded and sufficiently mixed. The testpieces were produced by injection molding this resin and were left standing in an environment of 70° C. and a 50% humidity.

Figure 10:
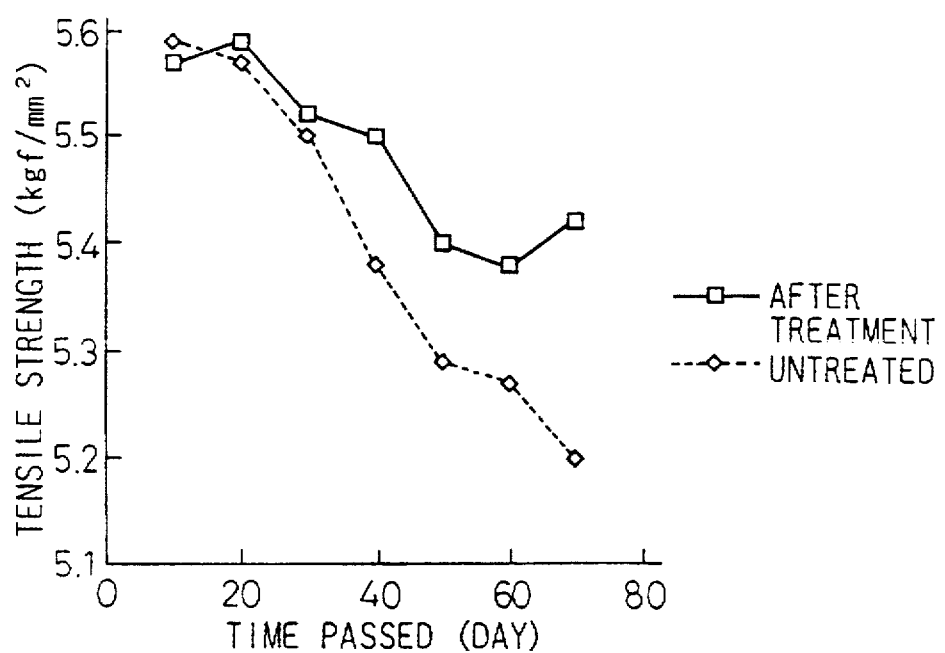
FIG. 10 is a diagram showing decomposability of injection molded articles in a high temperature and high humidity environment according to an example of the present invention and to a comparative example, respectively.
Figure 11:
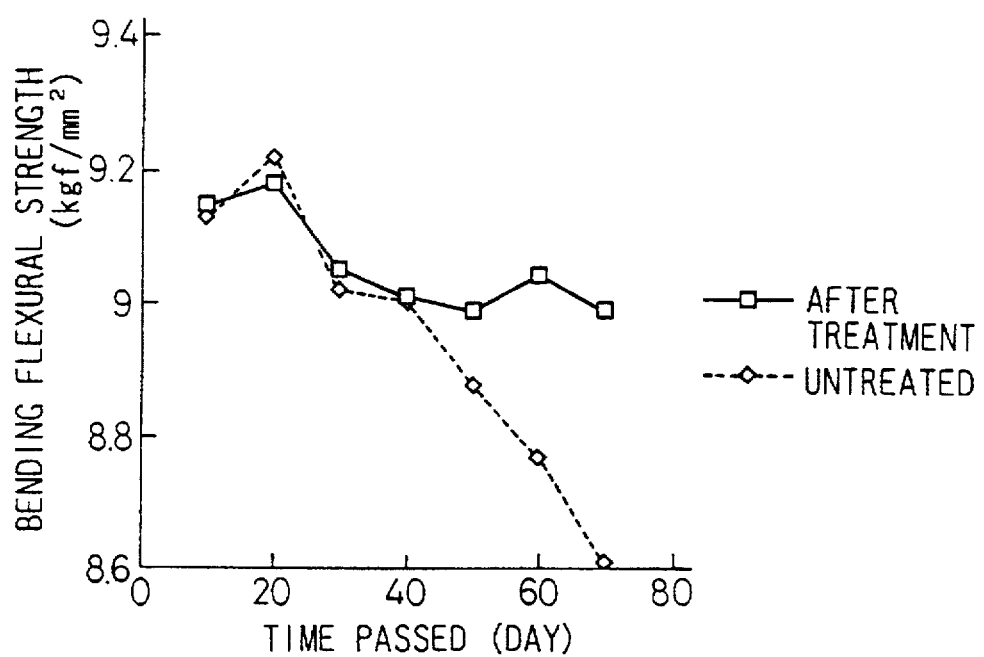
FIG. 11 is a diagram showing decomposability of injection molded articles in a high temperature and high humidity environment according to an example of the present invention and to a comparative example, respectively.

As a result, the drop in the mechanical strength could be kept at a lower level than the test result of the original resin (FIGS. 10 and 11).

Example 10

A thermosetting polyester resin is made into a composite with a glass fiber for reinforcement and is widely utilized for bath tubs, boats, skis, and so forth. A commercially available resin plate (reinforced by 35 wt % of the glass fiber) was finely pulverized to a grain diameter of not greater than 0.5 mm by a ball mill, etc. The water-soluble component was extracted by the same method as that of Example 8 and the amount of the acid or alkali component in the resin was measured. As a result, 0.055 mmol of the alkali component per 100 g of the resin was found contained therein.

Next, this resin was again melted by a resin kneader, and 0.0275 mmol per 100 g resin (0.055 mmol equivalent) of ammonium nitrate fine powder was kneaded and sufficiently mixed. The testpiece was produced using this resin by a hand lay up method. When the testpiece was immersed in boiling water at 100° C. and was left standing for 10 days, the drop in the mechanical strength could be limited to a lower level than the test result of the original resin.

Example 11

Figure 12:
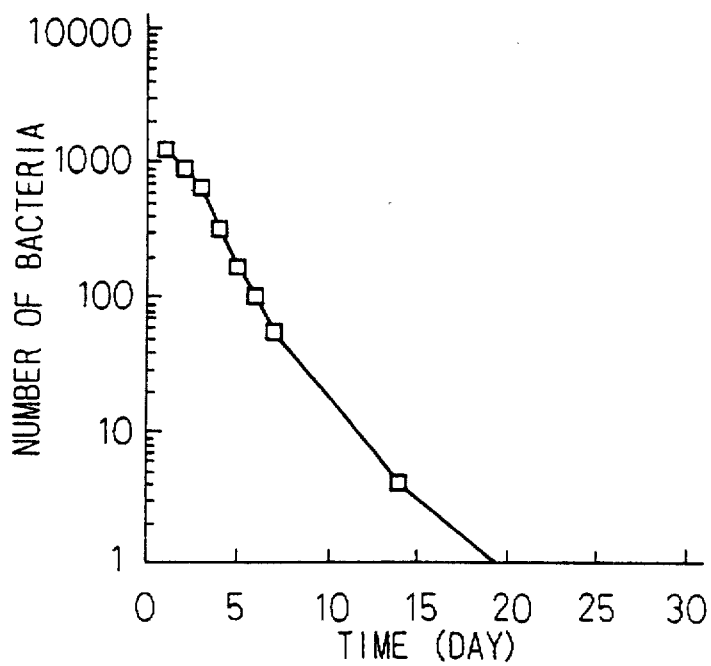
FIG. 12 is a diagram showing an antibiotic property of a biodegradable resin molded article obtained according to an example of the present invention.
Figure 13:
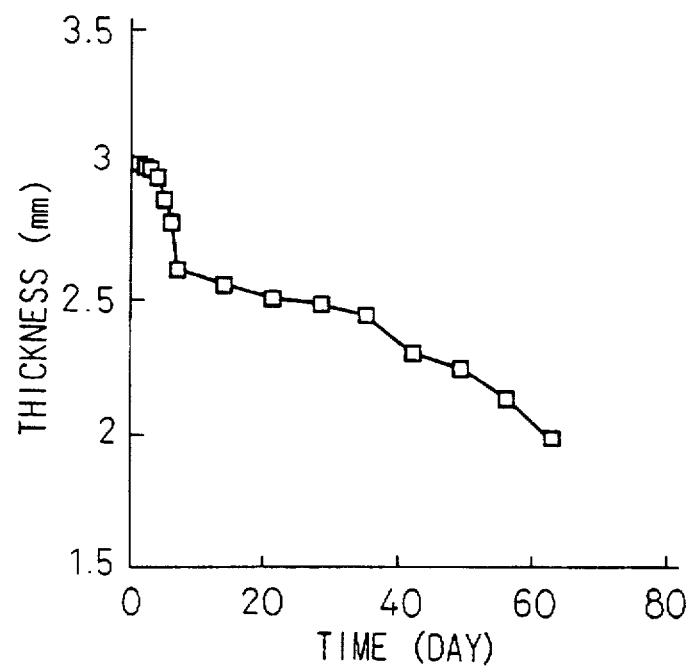
FIG. 13 is a diagram showing decomposability when a biodegradable resin molded article obtained in an example of the present invention is left standing outdoors.

This example used a polyhydroxybutyrate-polyhydroxyvalerate copolymer as the biodegradable resin, an ethylene-carbon monoxide copolymer as the photolytic resin and a silver ion on hydroxyapatite support as the antibiotic. A film of the photolytic resin containing the antibiotic was allowed to adhere to the biodegradable resin molded into a sheet form so as to protect the internal biodegradable resin. When the sheet material (1 cm×1 cm, 3 mm-thick) was placed into a container for incubating a strain belonging to the genus Pseudomonas sp.), which is known as a bacteria capable of decomposing biodegradable plastics, the number of living bacteria decreased with the passage of time and the bacteria was completely extinguished on the 20th day from the start of the test as shown in FIG. 12. A similar testpiece was left standing on black soil and the decomposition quantity was recorded as the change of the thickness by assuming that the sample was discarded under severe weather conditions. As a result, the surface layer was decomposed and disappeared in the first week due to photolysis as shown in FIG. 13 and then the portion of the biodegradable resin decreased to 66% of the initial thickness on the 60th day.

Example 12

This example used cellulose-chitosan as the biodegradable resin, polyisobutylene oxide as the photolytic resin and 2-(4-thiazolyl)-benzimidazole as the antibiotic. A film of the photolytic resin containing the antibiotic was molded on both surfaces of the biodegradable resin. The amount of the photolytic resin was 5 wt % on the basis of the weight of the biodegradable resin. When this sheet-like molded article was buried in a wooded area, both the weight and the initial strength retained the initial values even after the passage of three months. In contrast, when the same molded article was irradiated by ultraviolet rays having a wavelength of 300 nm for three days and nights and was then buried in the wooded area, the drop in the weight of 20% and the drop of the tensile strength of 40% were observed after three months from being buried.

As described above, the biodegradable resin molded article according to the present invention has biodegradability, and has sufficient strength and durability required for the application of high durability materials such as casings of electric components and computers. Incidentally, the substances existing in the nature, which are mixed in as additives, are not biologically decomposed. However, after the resin is decomposed, only the components which exist in nature remain, and for this reason, an adverse influence on the natural environment can be kept to a minimum. The biodegradable resin molded article is decomposed and extinguishes in a culture solution containing bacteria or in the soil. Accordingly, the volume of waste can be reduced, and wiring metals of the electric circuit substrate can be recovered. The resin raw materials built up in the bacteria can be recycled by extracting them.

Further, the present invention can provide an injection molded article of the biodegradable resin having durability and a molded article of a polyester resin.

Furthermore, the present invention can provide a resin molded article having high durability during use and capable of inducing biodegradation after use, and can contribute greatly to convenience of biodegrable resins.

We claim:

1. A biodegradable molded article comprising a molded mixture of a biodegradable resin and thermophilic bacteria.

2. A biodegradable molded article according to claim 1, wherein the molded mixture further comprises a naturally occurring biodegradable polymer.

3. A biodegradable molded article according to claim 1, wherein the molded mixture further comprises fibers or particles of carbon, silicon monoxide and silicon dioxide.

4. A biodegradable molded article according to claim 1, wherein the molded mixture further comprises at least one of magnesium hydroxide and aluminum hydroxide.

5. A biodegradable molded article according to claim 1, wherein the biodegradable resin is a polyester, polyvinyl alcohol, denatured starch, a polymer occurring in nature or a polyisocyanate.

6. A biodegradable molded article according to claim 1, wherein the molded mixture is molded by extrusion molding or by injection molding.

7. A biodegradable molded article according to claim 1, wherein in the molded article is the form of a flat plate.

* * * * *